United States Patent [19]

Godfrey

[11] Patent Number: 4,717,946
[45] Date of Patent: Jan. 5, 1988

[54] THIN LINE JUNCTION PHOTODIODE

[75] Inventor: Lawrence A. Godfrey, Rowland Heights, Calif.

[73] Assignee: Applied Solar Energy Corporation, City of Industry, Calif.

[21] Appl. No.: 801,495

[22] Filed: Nov. 22, 1985

Related U.S. Application Data

[63] Continuation of Ser. No. 486,732, Apr. 20, 1983, abandoned.

[51] Int. Cl.[4] ............................................. H01L 27/14
[52] U.S. Cl. ...................................... 357/30; 357/16; 357/20; 357/68
[58] Field of Search .................... 357/30, 16, 20, 65, 357/68, 52, 56, 48, 91

[56] References Cited

U.S. PATENT DOCUMENTS

| | | | |
|---|---|---|---|
| 3,733,527 | 5/1973 | Migitaka et al. | 357/16 |
| 3,959,646 | 5/1976 | de Cremous | 357/30 |
| 4,077,819 | 3/1978 | Hutson | 357/52 |
| 4,091,409 | 5/1978 | Wheatley, Jr. | 357/65 |

Primary Examiner—James W. Davie
Assistant Examiner—Georgia Y. Epps
Attorney, Agent, or Firm—Flehr, Hohbach, Test, Albritton & Herbert

[57] ABSTRACT

Photodiode structure and method of manufacturing the same, wherein the photodiode has a combination of very high shunt resistance and exceptionally low capacitance with only a slight loss in sensitivity. The diode junction is formed by a narrow line, and the geometry of the device can take many forms. The device has a typical shunt resistance of 150 megohms and a typical capacitance of 80 picofarads for an equivalent photosensitive area of 1 cm$^2$, which cannot be achieved by current standard technology.

12 Claims, 15 Drawing Figures

FIG_1
(PRIOR ART)

FIG_2
(PRIOR ART)

FIG_3

FIG_4

FIG_5

FIG_6

FIG_7

FIG_8

FIG_9

FIG_10

FIG_11

FIG_12

FIG_13

FIG_14

FIG_15

THIN LINE JUNCTION PHOTODIODE

This is a continuation of application Ser. No. 486,732 filed Apr. 20, 1983, abandoned.

BACKGROUND OF THE INVENTION

1. FIELD OF THE INVENTION

This invention pertains generally to semiconductors, and more particularly to photodiodes and methods of fabricating the same.

2. DESCRIPTION OF THE RELATED ART

In order to maximize the advantage of the high sensitivity of photodiodes to light, it is important that the diodes exhibit very low electrical noise when coupled to electronic circuitry. Typical applications include solid state detectors for tomographical instruments, security scanners, and other applications in which very low light levels must be measured accurately.

The parameters which most affect the ability of a detector to measure low light levels are the responsivity to the particular wavelength of light, and the area, the capacitance and the shunt resistance of the diode. Most photodiodes have good sensitivity at their operating wavelengths, but the other parameters are difficult to optimize with photodiodes of the prior art. The optimum parameters are large area, low capacitance and high shunt resistance. Since capacitance is proportional to area, increasing the area of prior art devices has also increased the capacitance. There have been attempts to reduce the capacitance by increasing the resistivity of the starting material, but this has resulted in an undesired decrease in the shunt resistance. The use of a starting material of high resistivity also has the disadvantages of high cost, difficult processing due to the susceptibility of high resistivity materials to contamination, and a large amount of edge damage during dicing of wafers which tends to reduce the shunt resistance.

It is in general an object of the invention to provide a new and improved photodiode structure and method of manufacture which overcome the foregoing and other disadvantages of photodiodes heretofore provided.

Another object of the invention is to provide a photodiode of the above character which has a relatively large equivalent photosensitive area, a relatively low capacitance and a relatively high shunt resistance.

SUMMARY OF THE INVENTION

These and other objects are achieved in accordance with the invention by providing a photodiode in which the diode junction is formed as a thin line junction between materials of opposite conductivity types. The effective diode junction is decreased by several orders of magnitude, thus greatly reducing the capacitance compared to the prior art for the same light sensitive area, even if a lower resistivity base material also increases the shunt resistance. Thus the new photodiode has both low capacitance and high shunt resistance.

DESCRIPTION OF THE PREFERRED EMBODIMENTS

Figure 1:
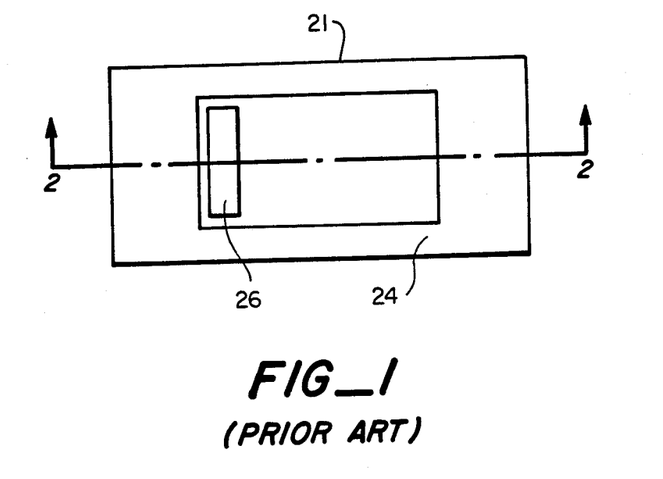
FIG. 1 is a top plan view of a photodiode of the prior art.
Figure 2:
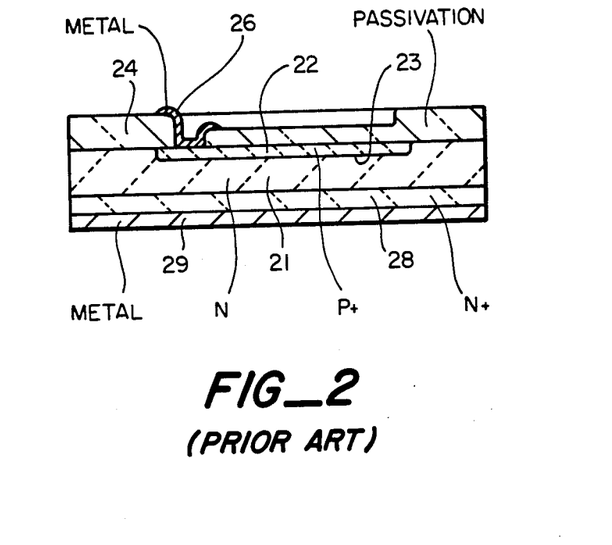
FIG. 2 is a cross-sectional view taken along line 2—2 in FIG. 1.

The prior art photodiode illustrated in FIGS. 1-2 comprises a generally planar semiconductor substrate 21 of N-type material in which a relatively wide region 22 of P+ material is formed, with a diode junction 23 being formed between the P+ material and the substrate. This junction extends over a relatively wide area, and consequently the diode has a high junction capacitance. A passivation layer 24 is formed over the surface of the substrate and the P+ region, and a metal contact 26 extends through an opening in the passivation layer to make contact with the P+ region. The lower portion of the substrate is doped with an N+ material 28, and a metallization layer 29 is formed on the underside of the substrate to provide electrical contact with the substrate body.

As noted above, the photodiode of FIGS. 1-2 has a relatively large junction area and a high capacitance. While the capacitance can be reduced by using a substrate material having a higher resistivity, this is done at the expense of a decreased shunt resistance.

Figure 3:
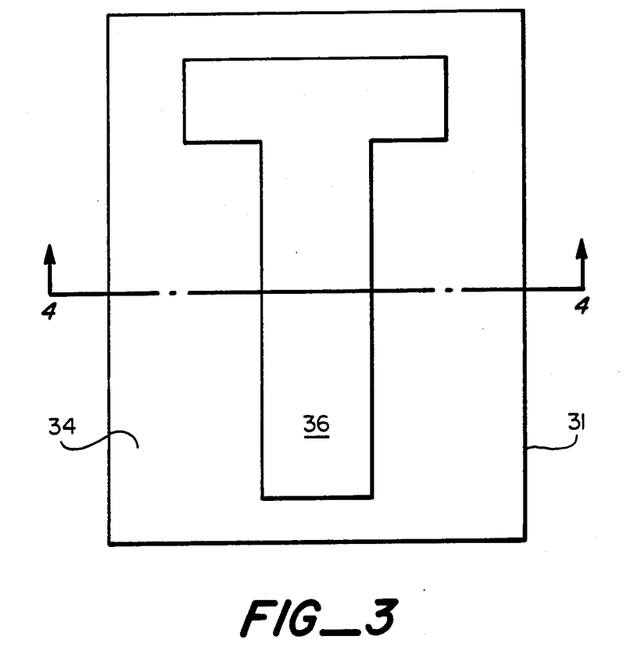
FIG. 3 is a top plan view of one embodiment of a photodiode according to the invention.
Figure 4:
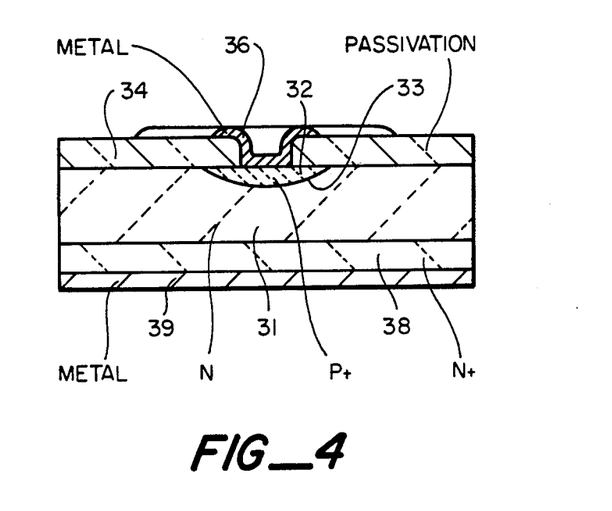
FIG. 4 is a cross-sectional view taken along line 4—4 in FIG. 3.

In the embodiment of FIGS. 3-4, the photodiode includes a generally planar substrate 31 which for purposes of illustration is shown as being an N-type material. A relatively narrow P+ region 32 is formed by diffusion or implantation near the upper surface of the substrate, and a thin line diode junction 33 is formed between the P+ region and the substrate. A passivation layer 34 is formed over the surface of the substrate and the P+ region, and a metallized contact 36 extends through an opening in the passivation layer to the P+ region. The P+ region has a generally T-shaped configuration in plan view, and contact 36 overlies the entire length of the P+ region and most of its width. The T-shaped configuration is not a fundamental requirement of this or other embodiments of a photodiode according to the invention. The cross of the T-shaped configuration is just convenient for electrical connection to the photodiode. This contact point can be relocated according to the overall design requirements. The metallized contact can extend to the lateral edges of the P+ region but should not extend beyond these edges if minimum capacitance is to be maintained. The lower portion of the substrate is doped with an N+ material 38, and a metallization layer 39 is formed on the underside of the substrate to provide a contact for the substrate body. The widths of P+ region 32 and metal contact 36 are made as small as possible in order to reduce the junction capacitance and to reduce the reflection of light by the metal contact which tends to reduce the effective photodiode area. With existing photodiode photolithography techniques, widths on the order of 50-100 microns can be provided. The depth of the P+ region is not critical and can be determined by good manufacturing practices. It typically is on the order of 0.1-1.0 micron. The N+ region typically has a width on the order of ten times the width of the P+ region, but this ratio is not critical.

The manner in which electron-hole pairs generated in the bulk semiconductor by the absorption of photons is detected is substantially different in the embodiment of FIGS. 3-4 than in the prior art device of FIGS. 1-2. In the prior art device, a hole generated in the substrate 21 will diffuse upwardly toward the junction 23 and be swept across the junction by the electrical field in the depletion region and be collected at the P-contact 26. In general, the minority carrier has only tens of microns to travel at short wavelength, and it may even be generated within the junction itself. Therefore, the minority carrier lifetime is not critical for most wavelengths. In the diode of FIGS. 3-4, the net diffusion direction is horizontal rather than vertical. In this embodiment, the distance that the carriers have to diffuse is not dictated by the absorption length of the photons at the wavelength being detected, but more by the distance from the diffused line junction that the photon enters the detection surface. This distance can be a few millimeters, rather than the relatively short distances for standard devices. For this reason, it is important that the material used for substrate 31 have relatively long carrier lifetimes to maintain good responsivity and uniformity of response. In addition, the front passivated layer should be very clean. Otherwise excess carriers will recombine at the surface, thereby reducing both the responsivity and the shunt resistance of the device.

Figure 5:
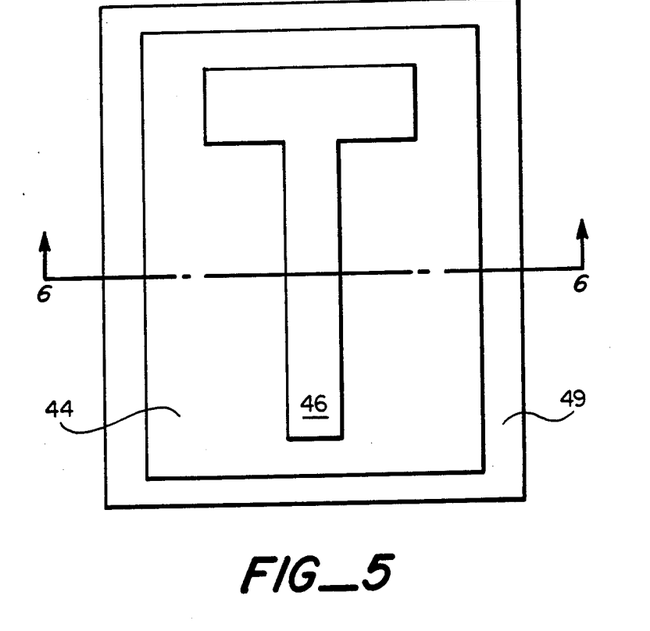
FIG. 5 is a top plan view of another embodiment of a photodiode according to the invention.
Figure 6:
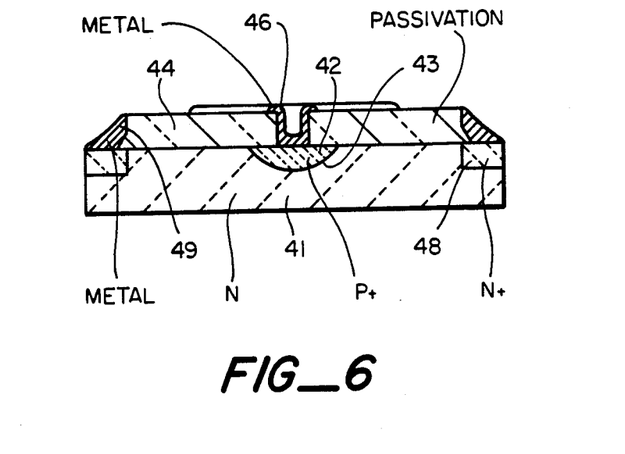
FIG. 6 is a cross-sectional view taken along line 6—6 in FIG. 5.

In the embodiment of FIGS. 5-6, the photodiode comprises a generally planar substrate 41 of N-type material in which a relatively narrow diffused or implanted region 42 of P+ material is formed, with a thin line diode junction 43 being formed between the P+ material and the body of the substrate. A layer 44 of passivation material is formed over the surface of the substrate and the P+ region, and a metallized contact 46 extends through an opening in the passivation layer to the P+ region. In this embodiment, the P+ region again has a T-shaped geometry in plan view, and contact 46 overlies the entire length of the P+ region and most or all of its width. An N+ region 48 is formed at the periphery of the upper surface of the substrate, and a metallized contact 49 is formed above this region to provide contact with the substrate body. In this embodiment, the widths of P+ region 42 and contact 46 are again made as small as possible, e.g. 50-100 microns, and the depth of the P+ region is not critical, e.g. 0.1-1.0 microns. The dimensions of N+ region 48 are similar.

With contacts 46, 49 both on the upper side of the substrate, any electric field between these two electrodes has a dominant horizontal vector component. This component can enhance the horizontal diffusion of the carriers and thus improve the responsivity and the frequency response of the device.

Figure 7:
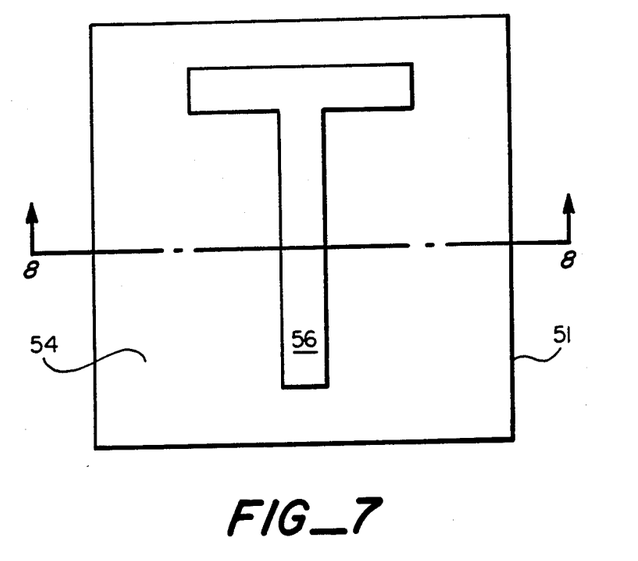
FIG. 7 is a top plan view of another embodiment of a photodiode according to the invention.
Figure 8:
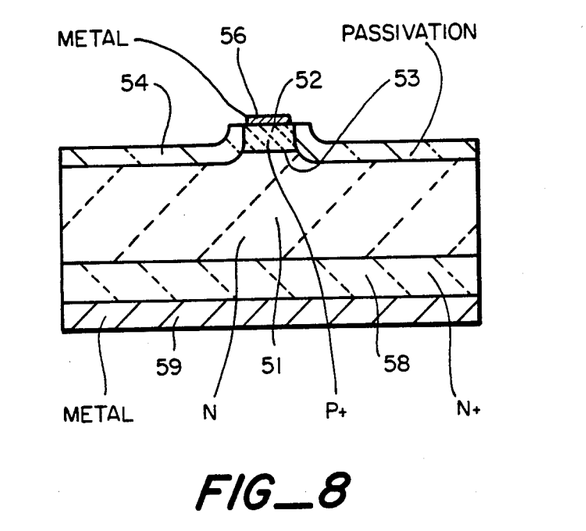
FIG. 8 is a cross-sectional view taken along line 8—8 in FIG. 7.

FIGS. 7-8 illustrate an embodiment using mesa technology. This embodiment includes a generally planar substrate 51 of N-type material, on which a mesa 52 of P+ material is formed, with a thin line diode junction 53 being formed between the P+ material and the body of the substrate. A passivation layer 54 is formed on the upper surface of the substrate and the sides of the mesa, and a metallized contact 56 is formed on top of the P+ mesa. The mesa has a generally T-shaped geometry in plan view, and the width of the mesa is approximately equal to the depth of the mesa. The lower portion of the substrate is doped with an N+ material 58, and a metallized contact is formed on the lower side of the substrate to provide a contact for the substrate body.

Figure 9:
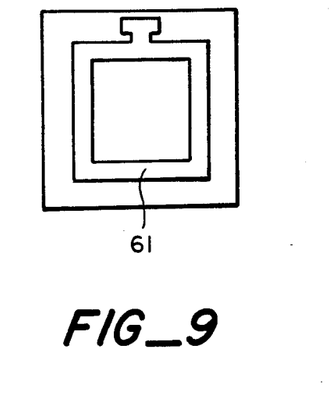
FIGS. 9-14 are top plan views of additional embodiments of photodiodes according to the invention.
Figure 10:
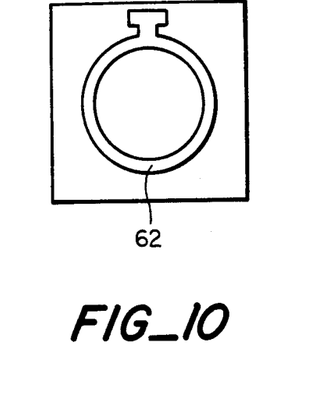
Figure 11:
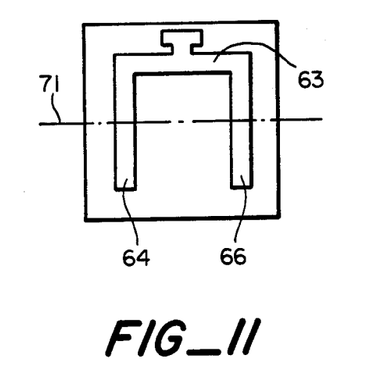

The region of P+ material which forms the diode junction with the substrate body can have a wide variety of geometries, several examples of which are illustrated in FIGS. 9-14. In FIG. 9, the P+ material extends along a path 61 which is generally rectangular in plan view. In FIG. 10, the P+ region extends along a path 62 which is generally circular in plan view. In FIG. 11, the P+ region extends along a generally U-shaped path 63 having a pair of generally parallel arms or fingers 64, 66. In each of these embodiments, the contact for the P+ region overlies the entire length and most or all of the width of the region, and the contact for the substrate body is formed on the underside of the substrate in the manner of the embodiment of FIGS. 3-4.

Figure 12:
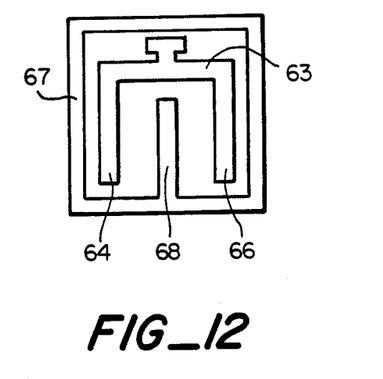

In the embodiment of FIG. 12, the P+ region extends along a generally U-shaped path 63 as in the embodiment of FIG. 11, but the contact 67 for the substrate body is formed on the upper side of the substrate as in the embodiment of FIGS. 5-6. This contact extends around the periphery of the upper surface of the substrate and, in addition, includes an arm 68 which extends inwardly from one edge of the substrate between fingers 64, 66 of the P+ region. An N+ region is formed beneath contact 67 and has the same geometry as the contact.

The use of junctions having a plurality of line sections, as in the embodiments of FIGS. 9-12, has been found to be advantageous from the standpoint of good sensitivity and/or frequency response when detectors more than a few millimeters wide are required. The distance between adjacent fingers or lines can be maximized in a manner consistent with good responsivity.

Figure 13:
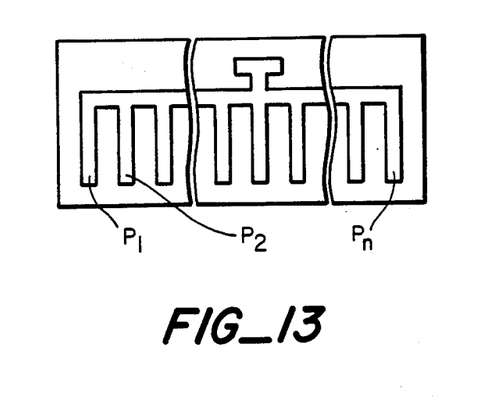
Figure 14:
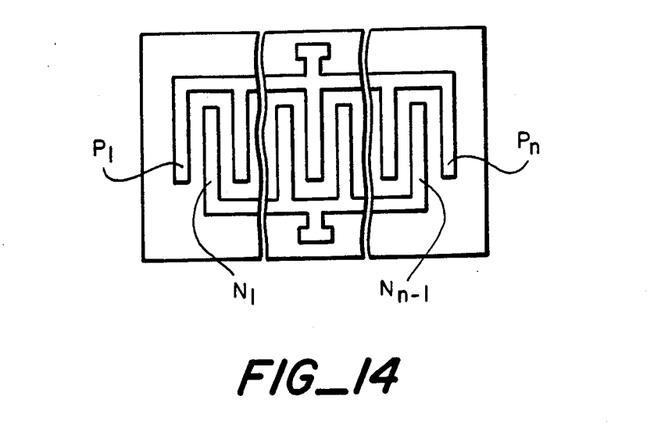

Additional P+ and/or N+ fingers or lines can be added as required, and generalized embodiments corresponding to the embodiments of FIGS. 11 and 12 are illustrated in FIGS. 13 and 14. The embodiment of FIG. 13 thus has n P+ fingers designated $P_1$ through $P_n$. The embodiment of FIG. 14 likewise has n P+ fingers, designated $P_1$ through $P_n$, and in addition has n−1 N+ fingers, designated $N_1$ through $N_{n-1}$, interspersed between the P+ fingers, with metallized contacts (not shown) overlying the N+ fingers. An embodiment can also be fabricated similar to FIG. 14 in which the N+ and P+ fingers or arms are reversed, thus giving n of the N+ fingers and n−1 of the P+ fingers.

Figure 15:
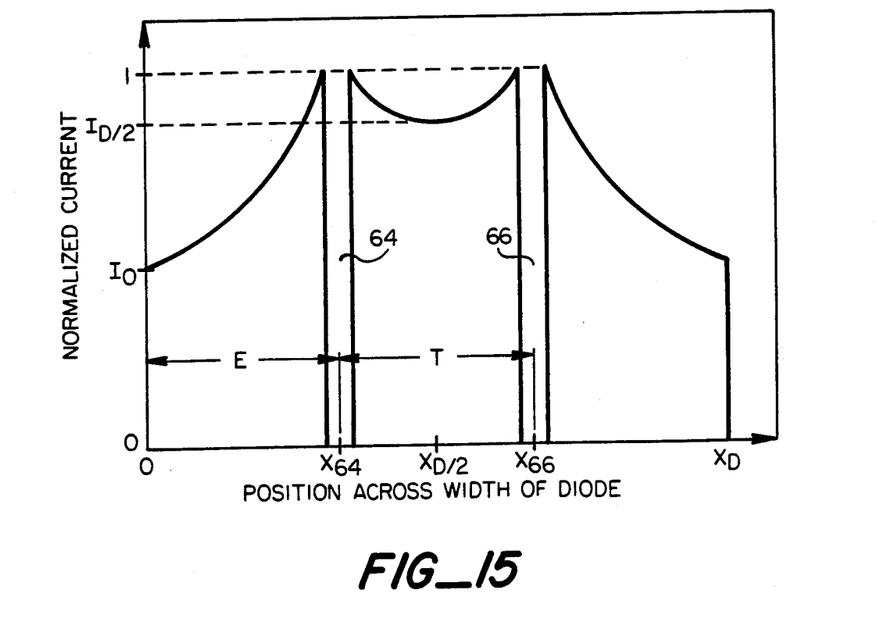
FIG. 15 is a graphical representation of the sensitivity of the detector to light as recorded by a small light spot scanned across the width of the detector in the embodiment of FIG. 11.

FIG. 15 shows qualitatively the sensitivity to light of the detector across the width of the detector in the embodiment of FIG. 11 as recorded by a small light spot scanned across the surface of the device along a line 71. In this figure, the position across the width of the diode is plotted along the X-axis, and the normalized current produced by the device is plotted along the Y-axis. During the scan from $X=0$ to $X=X_D$, the current starts at a minimum $I_O$, rises to a maximum on either side of the electrode centered at $X_{64}$, and drops to a local minimum $I_{D/2}$ at the center of the diode, $X=D/2$. Due to the symmetry of this embodiment of the device, the collected current distribution is symmetrical about $X=D/2$. High responsivity is obtained by maximized values $I_O$ and $I_{D/2}$ through using high lifetime starting material, low surface recombination velocity at the front surface layer, as well as geometry considerations. Reducing the distance $T = X_{66} - X_{64}$ between electrodes 64 and 66 increases the value of $I_{D/2}$. Reducing the distances $E = X_{64}$ and $X_D - X_{66}$ increases the value of $I_0$. Additional figures or lines may be added so that both T and E may be reduced simultaneously without reducing D. However, the use of too many diffused junctions will increase the capacitance of the detector. For a specific responsivity, the number of P+ fingers and the distance between them can be optimized to avoid unnecessary increase in capacitance.

While the examples described herein have all used P on N processing techniques, it will be understood that the photodiode can also be constructed with N on P, P+ on intrinsic on N+ (PIN) and N+ on intrinsic on P+ (NIP) techniques. The substrate can be fabricated of any suitable semiconductor material such as silicon, GaAs, GaAlAs, and other semiconductor materials suitable for use in the fabrication of planar or mesa photodiodes. Any suitable P dopants and N dopants can be used, such as boron or gallium and phosphorous or arsenic for silicon. For GaAs, zinc and tellurium can be used as P and N dopants, respectively.

With the invention, the photodiode has a very low capacitance and a high shunt resistance because the effective area of the junction is greatly reduced. Diodes fabricated in accordance with the embodiment of FIGS. 3-4 utilizing a 700 ohm-cm substrate material have given typical capacitances on the order of 35 picofarads and shunt resistances on the order of 500 megohms. A photodiode of prior art with the same 20 mm² area, fabricated on 4,000 ohm-cm substrate material has a typical capacitance on the order of 145 picofarads and a typical shunt resistance on the order of 50 megohms.

An interesting feature of the invention is that the capacitance of the diode is relatively independent of the width of the detector, unlike the case of a standard diode. The responsivity of the device, however, decreases as the width of the junction is increased, whereas the responsivity of standard devices is relatively insensitive to changes in geometry. Accordingly, the diode provided by the invention is best suited for longer, narrower designs, especially arrays which are used in instrumentation such as CAT scanners.

The invention has a number of important features and advantages. It is ideally suited for very low noise, large area detector applications where large shunt resistances and small capacitances are required. Typical useful capacitances of less than 100 picofarads, shunt resistances of more than 100 megohms, and responsivities approaching 0.20 A/W at 550 nm for a 25 mm by 5 mm silicon detector area have been achieved. An equivalent prior art detector would require more than one hundred thousand ohm-cm resistivity starting material and would probably give about one hundred times lower shunt resistance. The doide is also more economical to manufacture than devices utilizing standard geometries and materials of relatively higher resistivity. In addition, with the photodiode of the invention, edge damage during dicing has a negligible effect on the shunt resistance.

It is apparent from the foregoing that a new and improved photodiode structure and method of manufacturing the same have been provided. While only certain presently preferred embodiments have been described in detail, as will be apparent to those familiar with the art, certain changes and modifications can be made without departing from the scope of the invention as defined by the following claims.

I claim:

1. A photodiode structure comprising a substrate of a first conductivity-type material having a light receiving surface, a region of a second conductivity-type material positioned near the light receiving surface and forming with the first conductivity-type material a thin line diode junction across which a current flows in response to light impinging upon the light receiving surface, said diode junction having a width no greater than about 50-100 microns and a length substantially greater than the width, and electrically conductive contacts connected to the substrate and to the region of second conductivity-type material.

2. The photodiode structure of claim 1 wherein the region of second conductivity-type material extends along a closed path near the light receiving surface of the substrate.

3. The photodiode structure of claim 1 wherein the closed path is circular.

4. The photodiode structure of claim 1 wherein the closed path is rectangular.

5. The photodiode structure of claim 1 wherein the region of second conductivity-type material includes a plurality of elongated relatively narrow sections connected together, and one of the electrically conductive contacts overlies all of said sections.

6. The photodiode structure of claim 5 including a highly doped region of the first conductivity-type material positioned near the light receiving surface between two of the fingers of the second conductivity-type material, and one of the electrically conductive contacts is connected to the highly doped region.

7. A photodiode comprising a body of a first conductivity-type material having a light receiving surface on one side thereof, a plurality of generally parallel elongated regions of a second conductivity-type material connected together and positioned near the light receiving surface and forming with the first conductivity-type material a thin diode junction across which a current is produced by light impinging on the light receiving surface, said diode junction having a plurality of generally parallel line segments each having a width no greater than about 50-100 microns spaced across the light receiving surface, and electrically conductive contacts connected to the body and to the elongated regions for conducting the current away from the photodiode.

8. The photodiode of claim 7 wherein the contact connected to the elongated regions of second conductivity-type material overlies the regions on the side of the body on which the light receiving surface is located, and the other contact is connected to the body on the side opposite the light receiving surface.

9. The photodiode of claim 7 wherein the contact connected to the body comprises a plurality of generally parallel segments of conductive material interspersed between the regions of second conductivity-type material on the side of the body on which the light receiving surface is located.

10. A photodiode comprising a body of a first conductivity-type material having a light receiving surface on one side thereof, a plurality of generally parallel elongated regions of a second conductivity-type material connected together and positioned near the light receiving surface and forming with the first conductivity-type material a thin line diode junction across which a current is produced by light impinging on the light receiving surface, a first electrically conductive contact which extends in overlying relation along the elongated regions of second conductivity-type material, and a second electrically conductive contact connected electrically to the body of first conductivity-type material on the side of the body opposite the light receiving surface.

11. A photodiode comprising a body of a first conductivity-type material having a light receiving surface on one side thereof, a plurality of generally parallel elongated regions of a second conductivity-type material connected together and positioned near the light receiving surface and forming with the first conductivity-type material a thin line diode junction across which a current is produced by light impinging on the light receiving surface, a first electrically conductive contact which extends in overlying relation along the elongated regions of second conductivity-type material, and a second electrically conductive electrode comprising a plurality of generally parallel sections of conductive material connected electrically to the body and interspersed between the regions of second conductivity-type material on the side of the body where the light receiving surface is located.

12. The photodiode of claim 11 wherein the second conductivity-type material extends along a generally U-shaped path, and the second electrically conductive contact extends around the periphery of the body with an elongated portion extending between the regions of second conductivity-type material.

* * * * *